United States Patent [19]

Harberts et al.

[11] Patent Number: 4,839,904

[45] Date of Patent: Jun. 13, 1989

[54] APPARATUS FOR THE MELTING OF METALS

[75] Inventors: Aljet Harberts, Bruchkoebel; Josef Heimerl, Linsengericht; Horst Ranke, Alzenau, all of Fed. Rep. of Germany

[73] Assignee: Leybold-Heraeus GmbH, Cologne, Fed. Rep. of Germany

[21] Appl. No.: 114,782

[22] Filed: Oct. 30, 1987

[30] Foreign Application Priority Data

Jul. 18, 1987 [DE] Fed. Rep. of Germany ....... 3723912

[51] Int. Cl.[4] ............................................ H01J 37/305

[52] U.S. Cl. ........................................................ 373/10

[58] Field of Search ......................... 373/10, 11, 15, 16

[56] References Cited

U.S. PATENT DOCUMENTS 3,304,587 2/1967 Hov ........................................ 373/16

3,343,828 9/1967 Hunt ........................................ 373/16

*Primary Examiner*—Roy N. Envall Jr.

*Attorney, Agent, or Firm*—Felfe & Lynch

[57] ABSTRACT

An apparatus for melting metals in a vacuum chamber has a weir box (1), electron beam generators disposed above the weir box, and a crucible for the withdrawal of the melt flowing out of the weir box. A weir or sill is disposed in the trough athwart the length thereof, and it divides the trough into two basins and is situated underneath the one electron-beam source. The melt flowing from the one basin into the other runs in a thin film over the top of the weir or notch while the titanium nitrite in the melt is dissolved.

7 Claims, 3 Drawing Sheets

APPARATUS FOR THE MELTING OF METALS

BACKGROUND OF THE INVENTION

The invention relates to an apparatus for melting metals in a vacuum chamber with a weir box disposed therein, an electron beam generator disposed above the weir box, and a crucible for withdrawing the molten metal flowing out from the weir box.

It has long been a problem in electron beam technology, when recycling titanium, to dissolve the titanium nitrite which it contains. There are calculations according to which titanium nitrite would have to be in the melt for approximately 1000 seconds before it would be dissolved. This means that the weir box required would have to assume extremely large dimensions, which would have a negative effect on the energy balance. The use of such a large weir box is not a practical solution.

In electron beam melting furnaces it is furthermore known, for the improvement and further development of nickel-base alloys, to provide the weir box for receiving the melt with a mechanical weir in the form of a water-cooled copper strip. Such weirs have been placed on the upper, parallel marginal portions of the weir box, the bottom edge of the mechanical weir held across the flow of the melt being slightly immersed in the melt and thus holding back the floating impurities collecting on the surface of the melt, i.e., prevents them from passing over the spout into the offtake means or crucible. The nonmetallic inclusions in the melt can be eliminated additionally by means of an electrothermal barrier, an electron beam stripe running across the width of the trough ahead of the outlet spout.

The present invention sets for itself the task of creating an apparatus of the kind described above which will be especially adapted for dissolving rapidly and completely the titanium nitrite generally present in a titanium melt. At the same time the apparatus is to be made as compact and reliable in operation as possible.

SUMMARY OF THE INVENTION

According to the invention this is achieved by a sill or weir which is disposed in the weir box athwart the longitudinal direction thereof and dividing the weir box into two basins. The melt flows over the top of the weir in a thin film from the one basin into the other. The weir has cavities or passages through which a coolant flows, and it is situated in the direct range of action of the electron beam source.

Preferably, the thin-film weir is in the form of a substantially bar-shaped body which has a notch in its top, across which the melt flows before it continues on for further processing, while the electron beam dissolves the titanium nitrite contained in the melt in the area of the notch.

It is desirable to provide the thin-film weir with supports by which it is held on the bottom of the weir box, the supports being in the form of plate-like trestles disposed in planes perpendicular to the plane of the thin-film weir. Their bottom surfaces resting on the bottom of the trough extend slightly past the bottom of the thin-film weir or are in line with the bottom.

Advantageously, the thin-film weir has at least one opening in areas submerged in the melt, through which the melt can flow unhampered from one section of the weir box into the other.

To be able to remelt alloys containing easily evaporated elements such as aluminum, chromium or manganese in such a way as to minimize losses of these elements, nozzles are disposed in the area of the notch in the thin-film weir which correspond with passages which are connected to a gas source, the gas issuing from the nozzles flooding the surface of the melt and thus lowering the rate of evaporation.

Usually an inert gas is used for this purpose, such as argon. It is also possible, however, to flood the melt with reactive gases by means of this system in order to achieve a reaction between gas and the impurities in the molten metal, so as thus to remove the impurities in gaseous form from the molten metal (e.g., removal of carbon by oxygen gas).

Preferably, the coolant and gas connections are disposed at the two upper edges of the weir box. Lastly, the supports of the thin-film weir can be made adjustable in height so that the distance between the bottom of the weir box and the bottom of the thin-film weir will be variable.

BRIEF DESCRIPTION OF THE DRAWING

The invention admits of a great variety of embodiments; one of them is represented in the appended drawings, wherein.

DETAILED DESCRIPTION OF PREFERRED EMBODIMENT

Figure 1:
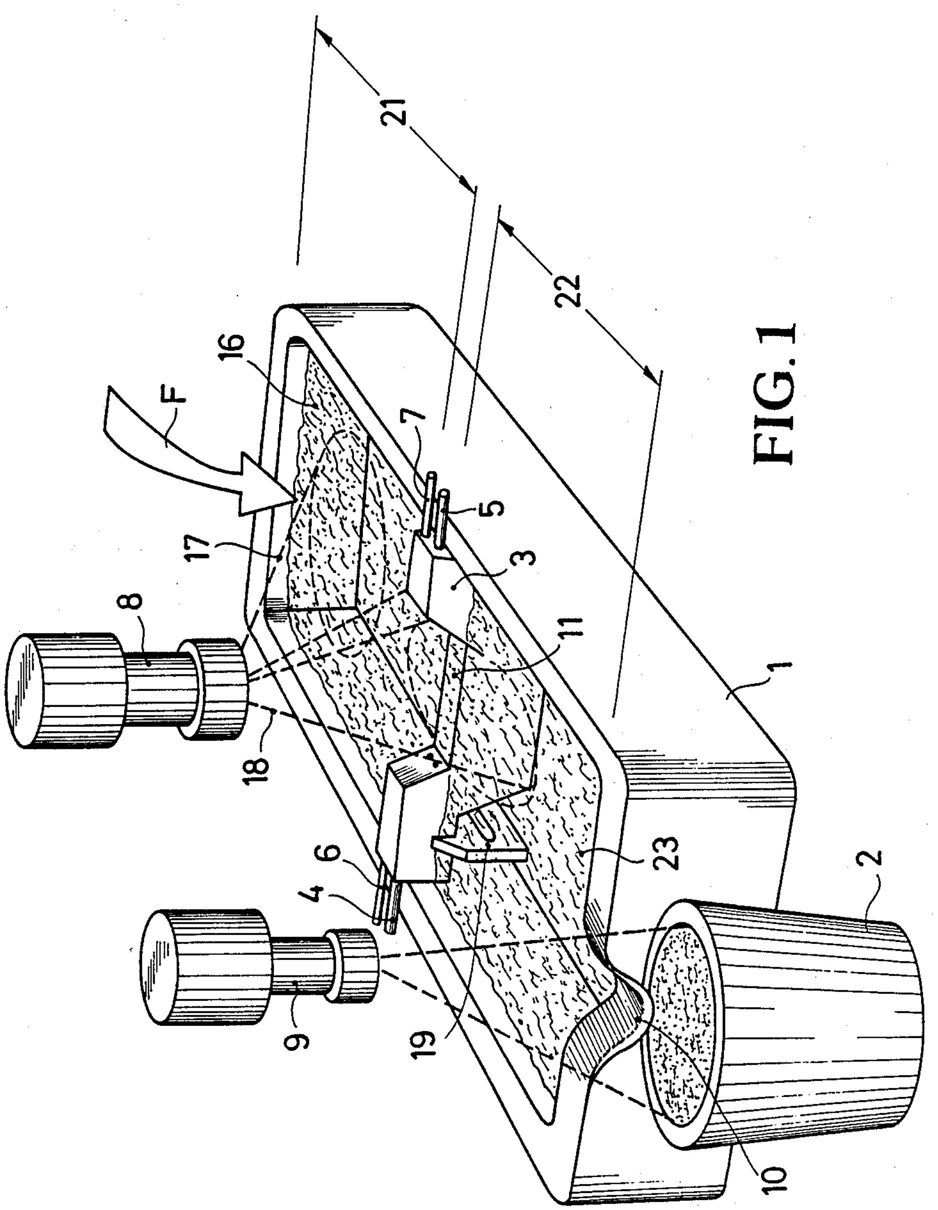
FIG. 1 is a perspective and merely diagrammatic view of a weir box with thin-film weir and crucible.

The apparatus consists of a weir box 1 disposed in a vacuum chamber which is not represented, an offtake crucible 2 set in front of the weir box 1, the thin-film weir 3 placed in the weir box 1 and provided with connections 4 and 5 for the coolant and the terminals 6 and 7 for an inert gas or a reactive gas, and the electron beam generators 8 and 9 fastened above the crucible 2 and above the weir box 1, respectively. The raw material is brought by a transport system not represented into the weir box 1, where it is melted by the electron beam generator 8. The molten material 16 moves then toward the pouring spout 10, but first it must flow over the notch 11 in the thin-film weir 3. The notch 11 is adjusted for this purpose such that the melt 16 moves across the notch 11 in the form of a film about 2 mm thick.

Figure 2:
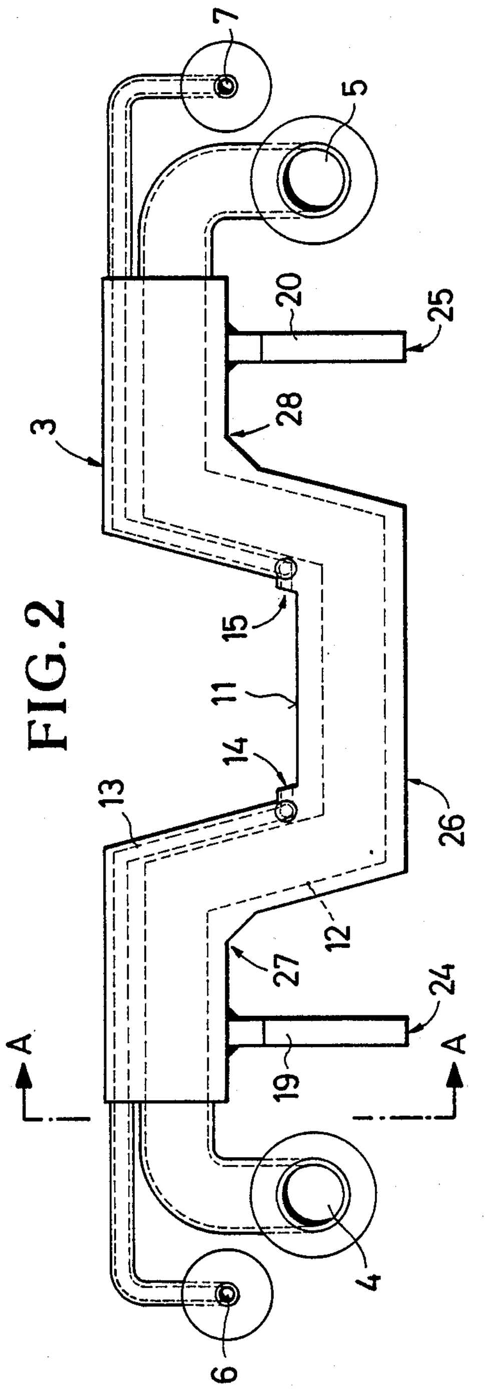
FIG. 2 is a side view of a thin-film weir.
Figure 4:
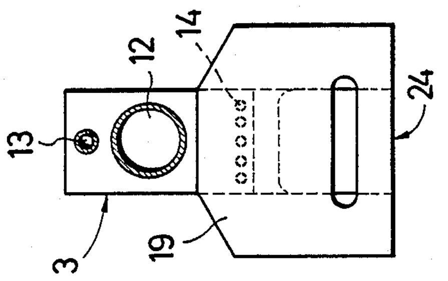
FIG. 4 is a cross-section taken through the thin-film weir along lines A—A of FIG. 3.
Figure 3:
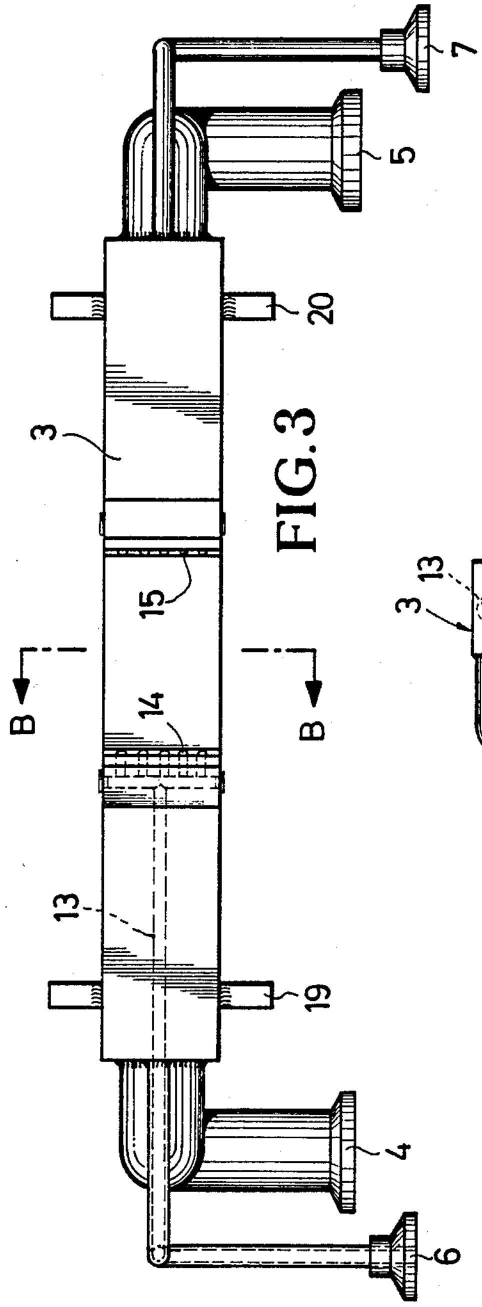
FIG. 3 is a top view of the thin-film weir of FIG. 2.
Figure 5:
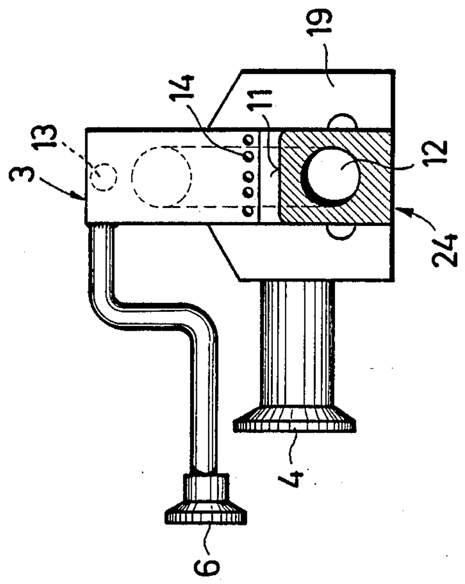
FIG. 5 is a section taken along lines B—B of FIG. 3.

As FIGS. 2 to 5 show, the thin-film weir 3 is provided with a coolant passage 12 which is connected by the connections 4 and 5 to a coolant circuit not shown, so as to assure that the material of which the thin-film weir 3 is made will not be attacked by the melt 16. Furthermore, the thin-film weir 3 has a gas passage 13 which terminates in two rows of gas nozzles 14 and 15 which are provided in the area of the notch 11.

The titanium nitrite particles in the titanium being recycled, for example, have approximately the same density as titanium and for this reason they are at a static depth in the bath, i.e., they can remain at any depth in the molten metal and are accordingly struck but statistically by the first electron beam 17. Due to the thin-film weir 3 situated in the melt 16, the titanium nitrite particles are forced to the surface and can be struck and dissolved directly by the second electron beam 18.

If a Ti6A14V alloy is remelted, losses usually occur in the electron beam remelting process. This loss is intensified in the case of electron beam bombardment on the thin-film weir 3. To compensate for this disadvantage, the thin-film weir 3 is equipped on both sides with a gas passage 13 having rows of nozzles 14 and 15, which correspond to the connections 6 and 7, and by means of which a higher residual gas pressure can be achieved in the area of the notch 11, which again reduces the aluminum losses.

With the system shown it is also possible to force chemical reactions with the molten metal film, if reactive gases are used instead of an inert gas, so that a new and greater degree of freedom is achieved in the control of material impurities in the molten state.

It is also to be noted that the thin-film weir 3 is provided with supports 19 and 20 whereby the thin-film weir 3 is supported on the floor of the weir box 1 and which enable the notch 11 to be held parallel to the surface of the melt and at the correct distance therefrom. The supports 19 and 20 can, of course, also be constructed such that the thin-film weir 3 will be adjustable in its height above the bottom of the trough.

We claim:

1. An apparatus for melting metals comprising, in a vacuum chamber, a weir box having a floor and sides extending upwardly therefrom, an electron beam generator disposed above said weir box and adapted to form a melt from metal, in combination with a crucible for withdrawing said melt flowing out of said weir box, said weir box being characterized by a thin film weir which divides said weir box into two basins, said thin-film weir being in the form of a substantially bar-shaped body which has in its middle part a notch-like recess at the top thereof, said melt flowing from the one basin into the other in a thin film, over said recess, said thin-film weir:

(a) having passages through which a coolant flows,
(b) having a plurality of passages through which gas flows and,
(c) being situated in the direct range of action of said electron beam generator.

2. The apparatus defined in claim 1 wherein said thin-film weir has plate-like projections extending in planes across the plane of the thin-film weir, said projections having bottom surfaces which rest on said floor of said weir box and which project slightly beyond the bottom of said thin-film weir.

3. The apparatus defined in claim 1 wherein said thin-film weir has plate-like projections extending in planes across the plane of the thin-film weir, said projections having bottom surfaces which rest on said floor of said weir box and which are aligned with the bottom of said thin-film weir.

4. The apparatus defined in claim 2 or in claim 3 characterized in either that said thin-film weir has at least one opening in portions submerged in said melt, through which said melt can flow unhampered from said one basin into the other said basin of the weir box.

5. The apparatus defined in claim 4 wherein nozzles are disposed in the area of said notch of said thin-film weir which correspond with passages connected to a gas source, said gas that issued from said nozzles flooding the surface of the melt.

6. The apparatus according to claim 5, wherein said coolant and said gas connections are disposed at both faces in the area of the top edges of the sides of said weir box.

7. The apparatus according to claim 6, wherein said supports of said thin-film weir are constructed for adjustment in their height, whereby the distance between the bottom of said weir box and the bottom of said thin-film weir is variable.

* * * * *